(12) United States Patent
Midya et al.

(10) Patent No.: US 6,605,991 B2
(45) Date of Patent: Aug. 12, 2003

(54) CIRCUITRY FOR CREATING A SPECTRAL NULL IN A DIFFERENTIAL OUTPUT SWITCHING AMPLIFIER AND METHOD THEREFOR

(75) Inventors: Pallab Midya, Schaumburg, IL (US); William Roeckner, Carpentersville, IL (US)

(73) Assignee: Motorola, Inc., Schaumburg, IL (US)

( * ) Notice: Subject to any disclaimer, the term of this patent is extended or adjusted under 35 U.S.C. 154(b) by 131 days.

(21) Appl. No.: 09/943,177

(22) Filed: Aug. 30, 2001

(65) Prior Publication Data

US 2003/0042976 A1 Mar. 6, 2003

(51) Int. Cl.$^7$ ................................................. H03F 3/38
(52) U.S. Cl. ........................ 330/10; 330/207 A; 330/251
(58) Field of Search ............................... 330/10, 207 A, 330/251

(56) References Cited

U.S. PATENT DOCUMENTS

| 4,164,714 A | | 8/1979 | Swanson | |
|---|---|---|---|---|
| 4,272,713 A | * | 6/1981 | Pritchard | .................... 318/696 |
| 4,968,948 A | | 11/1990 | Tokumo et al. | |
| 5,398,003 A | | 3/1995 | Heyl et al. | |
| 5,617,058 A | * | 4/1997 | Adrian et al. | .................. 330/10 |
| 5,740,112 A | * | 4/1998 | Tanaka et al. | ......... 365/189.01 |
| 5,818,260 A | * | 10/1998 | Kuo | .............................. 326/86 |
| 5,973,368 A | * | 10/1999 | Pearce et al. | ................ 257/368 |
| 6,111,431 A | * | 8/2000 | Estrada | ......................... 326/83 |
| 6,262,616 B1 | * | 7/2001 | Srinivasan et al. | .......... 327/264 |
| 6,313,662 B1 | * | 11/2001 | Ide | ................................ 326/83 |

FOREIGN PATENT DOCUMENTS

| WO | WO 92/12572 | 7/1992 | ............ H03F/3/393 |
|---|---|---|---|
| WO | WO 00/07291 | 2/2000 | ............. H03F/1/26 |

\* cited by examiner

Primary Examiner—Michael Tokar
Assistant Examiner—Linh Van Nguyen
(74) Attorney, Agent, or Firm—Robert L. King

(57) ABSTRACT

A modulated signal is connected to a full bridge switching amplifier (16, 18, 28, 30) and is compensated to remove a predetermined frequency and its odd harmonics. The compensation inverts and delays (26) a signal that is connected to a first half of the full bridge and applies the delayed inverted signal to a second half of the full bridge. By delaying by an odd number of half cycles, the carrier and its odd harmonics are cancelled because the same signal exists on both sides of the full bridge output. When these two same signals are subtracted by the full bridge action, the carrier and odd harmonics are suppressed. Spectral nulls may be provided for various signal applications, not just audio, and when various types of modulation techniques are used, such as PWM and PDM.

28 Claims, 4 Drawing Sheets

CIRCUITRY FOR CREATING A SPECTRAL NULL IN A DIFFERENTIAL OUTPUT SWITCHING AMPLIFIER AND METHOD THEREFOR

FIELD OF THE INVENTION

This invention relates generally to integrated circuits, and more specifically, to switching amplifiers for processing audio signals.

BACKGROUND OF THE INVENTION

Audio switching power amplifiers are well known and widely used. Such amplifiers receive an audio signal that has been modulated, such as a pulse modulated digital signal. Most high efficiency digital audio switching power amplifiers are based on Pulse-width modulation (PWM). PWM is widely used in a variety of applications such as digital audio amplifiers and control applications including motor controllers. Many of these applications convert a sampled digital signal to a digital pulse-width modulation signal in order to obtain high efficiency and high accuracy. The PWM signal is presented to a switching amplifier that performs a level shifting function to translate the digital PWM input signal to a digital PWM signal having significantly higher voltage levels. To accomplish the power amplification, a higher voltage power supply is used.

A class of switching amplifiers is known as class AD. Class AD is a modulation form where only two discrete levels are used, e.g., 1 and −1. In a class AD modulated amplifier, either plus the power supply voltage or minus the power supply voltage is applied to the load.

A source of noise in switching amplifiers is associated with the frequency at which the output signal is switched when being amplified. A noise component exists at the switching frequency and at harmonics thereof. Although the noise in the frequency spectrum at the switching frequency and its harmonics is typically out of the passband, such noise nonetheless creates standby power loss due to circulating currents and thereby reduces efficiency. In order to remove these undesired frequency components, a filter is usually required to eliminate the switching or carrier frequency. For typical systems, a four-pole L-C filter is necessary to sufficiently suppress the switching frequency. Because of its size and required inductive elements, the filter is one part of the system that is not suitable for integration. Additionally, the cost of such a filter is significant and typically eliminates such switching amplifiers from low cost high volume applications.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
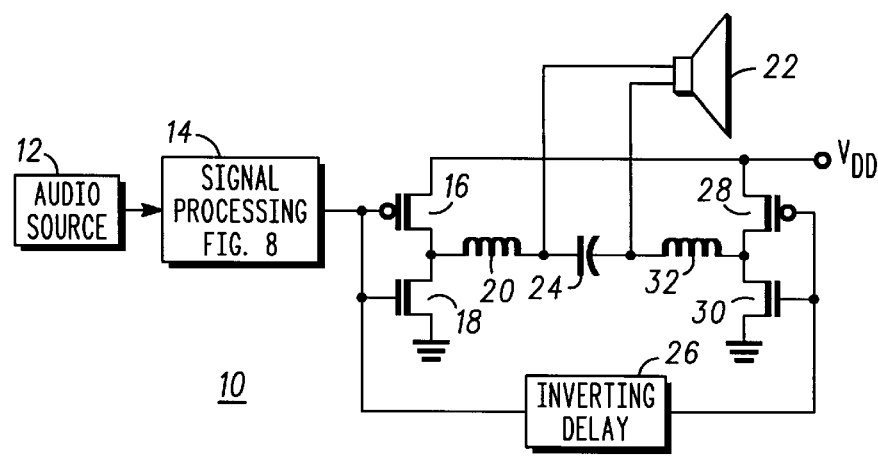
FIG. 1 illustrates in block diagram form a switching amplifier in accordance with the present invention.

Illustrated in FIG. 1 is a switching amplifier 10 having a spectral null in accordance with the present invention. For purposes of illustration, an example will be provided using an audio signal. It should be well understood that the present invention is applicable to any type of signal, other than audio signals, where it is desired to create a spectral null. An audio source 12 provides a signal to an input of a signal processing unit 14. The audio source 12 may be any type of source that will be used to provide an audio signal. For example, audio source 12 may be a compact disc (CD) player source, a received radio signal, a received television audio signal, an internet audio signal or any other type of audio signal. The audio source 12 may be either digital or analog. An output of the signal processing unit 14 is connected to a first half bridge switching amplifier in the form of a P-channel transistor 16 and an N-channel transistor 18. In the illustrated form, P-channel transistor 16 has a source connected to a positive power supply terminal, labeled VDD. A gate of transistor 16 is connected to both a gate of N-channel transistor 18 and to the output of signal processing unit 14. A drain of transistor 16 is connected to a drain of N-channel transistor 18. A source of N-channel transistor 18 is connected to a ground reference terminal or a voltage reference terminal. The drains of transistors 16 and 18 are connected to a first terminal of an inductance 20. A second terminal of inductance 20 is connected to a first terminal of a speaker 22 and to a first electrode of a capacitor 24. A second terminal of speaker 22 is connected to a second electrode of capacitor 24. The output of signal processing unit 14 is also connected to an input of an inverting delay unit 26. An output of inverting delay unit 26 is connected to a second half bridge switching amplifier formed by a P-channel transistor 28 and an N-channel transistor 30. The output of inverting delay unit 26 is connected to a gate of each of transistors 28 and 30. Transistor 28 has a source electrode connected to the power supply terminal labeled VDD. A drain of transistor 28 is connected to a drain of transistor 30 and to a first terminal of an inductance 32. A source of transistor 30 is connected to the ground reference terminal or a voltage reference terminal. A second terminal of inductance 32 is connected to the second terminal of speaker 22 and to the second electrode of capacitor 24. It should be appreciated that various elements of switching amplifier 10 may be incorporated into a single integrated circuit depending upon design choice. For example, the full bridge amplifier formed by transistors 16, 18, 28 and 30 may be incorporated onto an integrated circuit with the signal processing unit 14 and inverting delay 26 depending upon the power drive requirements of a particular application. For very high wattage outputs, it may be desired that transistors 16, 18, 28 and 30 be implemented as discrete power devices that can provide a large amount of output power. It should be well understood that the full bridge amplifier formed by transistors 16, 18, 28 and 30 may be implemented by other circuitry and other circuit techniques than the devices shown. The type of full bridge amplifier chosen depends on voltage ranges to be used and the type of product application.

In operation, audio source 12 provides an audio signal to the signal processing unit 14. Signal processing unit 14 is described in further detail in connection with FIG. 8. The audio signal that is provided by audio source 12 will be in modulated form in accordance with some modulation technique, such as pulse density modulation (PDM), pulse width modulation (PWM) or pulse code modulation (PCM). The type of modulation may be referred to as a signal type. Signal processing unit 14 functions to take the audio signal and perform a modulation conversion to convert the audio signal to a digital pulse width modulation signal. In the event that the audio signal is presented to signal processing unit 14 as a PWM signal, then no modulation conversion technique is required. In addition, signal processing unit 14 may modify the sampling rate of the audio signal and performs filtering as will be described below in connection with FIG. 8. The input sample rate is typically low so the signal is up sampled to bring it up to a desired sampling frequency. For applications where the input sample rate is high, the signal is down sampled to bring it down to the desired sampling frequency. The desired sampling frequency is typically twice the switching frequency for two-sided PWM. Two-sided PWM is characterized by both the rising and the falling edges of a PWM signal being modulated. The desired sampling frequency is typically equal to the switching frequency for one sided PWM.

Signal processing unit 14 provides a single PWM signal at a predetermined clock rate having a corresponding cycle time, Ts, that functions as a switching signal. The PWM switching signal is connected directly to the half bridge formed by transistors 16 and 18. A first switching signal is thus connected to a first input formed by the gate electrodes of transistors 16 and 18. The result is to couple either a logic one or a logic zero value to inductance 20. The signal content is a function of the amount of time that either a $V_{DD}$ or a ground value is coupled to inductance 20. Concurrently, the half bridge formed by transistors 28 and 30 receives a second switching signal that is a delayed and inverted version of the first switching signal (the PWM output signal) provided by the signal processing unit 14. The inverting delay unit 26 generates a second switching signal that is inverted and delayed by a delay amount as compared with to the first switching signal. The second switching signal is connected to a second input formed by the gate electrodes of transistors 28 and 30. In one form, the delay amount is at least approximately a quarter of a cycle of the switching frequency. In another form, the delay amount is a multiple of approximately half of the cycle time. Therefore, each pulse of the second switching signal has a same pulse width as a corresponding pulse of the first switching signal. Since the second half of the bridge uses a delayed and inverted version of the PWM signal in the first half of the bridge, no additional computation for the second half of the bridge is required by the signal processing unit 14. Such computation typically involves up sampling and conversion to a PWM duty ratio for two switching signals for a full bridge application. The computation cost is a significant fraction of the cost of the switching amplifier system so that the elimination of such computation helps make this solution available for lower-cost, high-volume audio products.

In another form, the second switching signal is delayed by an odd number of half cycles of the switching frequency. It should be understood that as used herein, the term "switching frequency" is the same as a "carrier frequency" or "carrier". The two digital PWM signals are input to the full bridge power stage formed by transistors 16, 18, 28 and 30. The full bridge power stage amplifies the PWM signal. The PWM power signals are input to a low pass filter formed by inductors 20 and 32 and capacitor 24. The low pass filter is a conventional passive LC network. By delaying by an odd number of half cycles, the carrier and its odd harmonics are substantially suppressed because the same signal exists on both sides of the full bridge output. When these two same signals are subtracted by the full bridge action, the carrier and odd harmonics are cancelled. The output of the low pass filter drives the load that is speaker 22.

Figure 2:
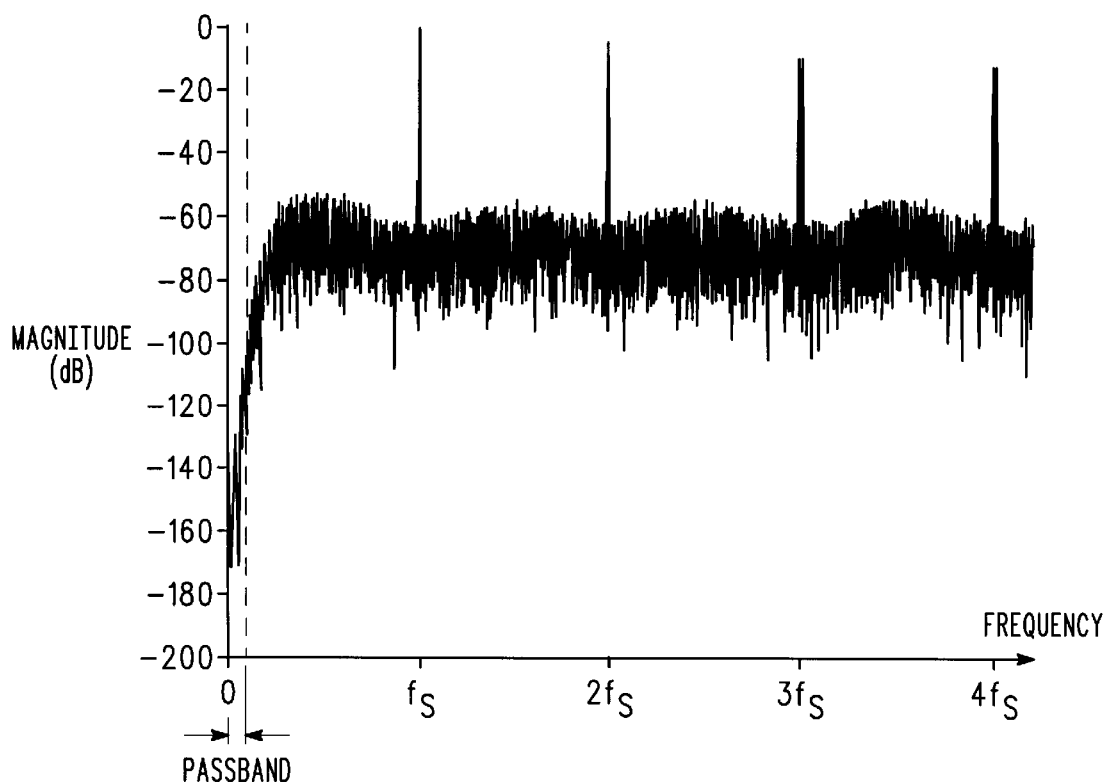
FIG. 2 illustrates in graphical form a frequency spectrum of an output signal of a switching amplifier.

Illustrated in FIG. 2 is a graphical representation of the frequency spectrum for a PWM signal at the output of a full bridge switching amplifier. Note that there exists a significant amount of switching noise at the carrier or switching frequency, $f_S$, and all integer harmonics. The noise in the passband has been minimized by noise shaping. Although the switching frequency and its harmonics are not in the passband and thus cannot be heard in a speaker, they result in power loss and possible interference with other circuitry (not shown) in an audio system. The power loss typically manifests itself in unwanted excessive heat for the system. It should be understood that although the term "passband" is used, the term "baseband" may be more applicable in some applications of the invention.

Figure 3:
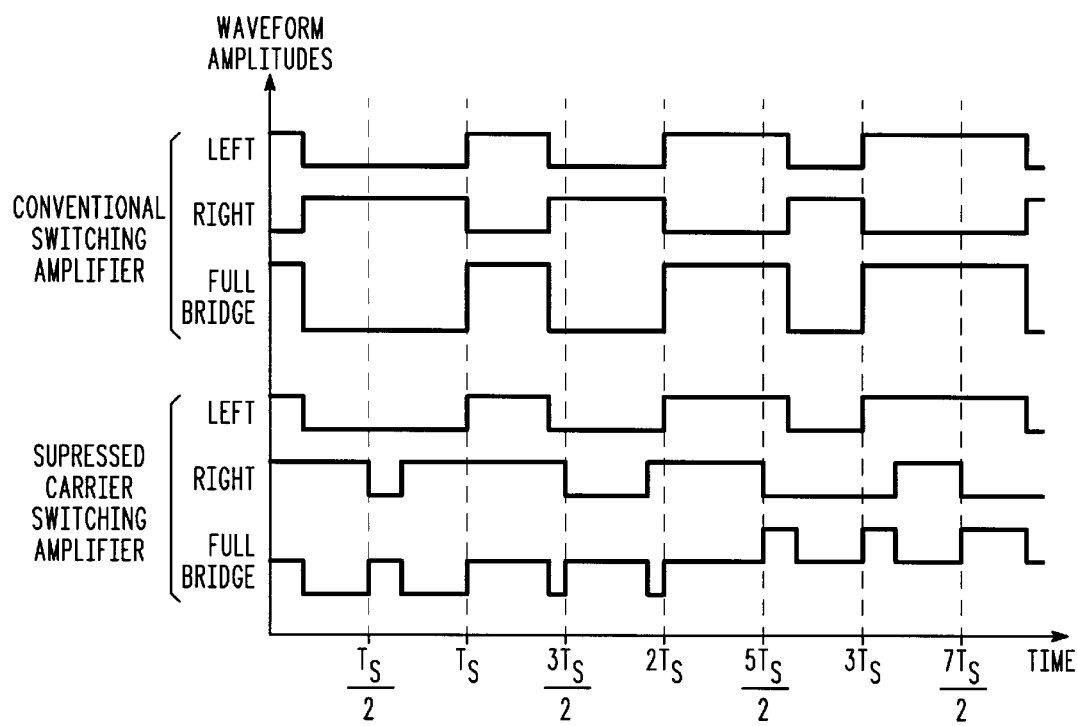
FIG. 3 illustrates waveforms associated with left, right and full bridge signals of a differential output of a switching amplifier with and without carrier suppression.

Illustrated in FIG. 3 is a graphical representation of waveform amplitudes for a switching amplifier without and with carrier frequency suppression. When there is no carrier suppression, the PWM signals on the left and right half of the bridge are equal in magnitude and opposite in sign. The resulting differential signal at the full bridge is approximately twice in magnitude the signal at one side of the full bridge. When there is carrier suppression, the PWM signals on the left and right half of the bridge are again equal in magnitude and opposite in sign. However, the right side of the bridge is delayed from the left side by an odd number of half cycles. The resulting full bridge output signal does not have the carrier frequency. By delaying N half cycles, where N is an odd integer, nulls are created at the carrier frequency divided by N and all its odd harmonics.

Figure 4:
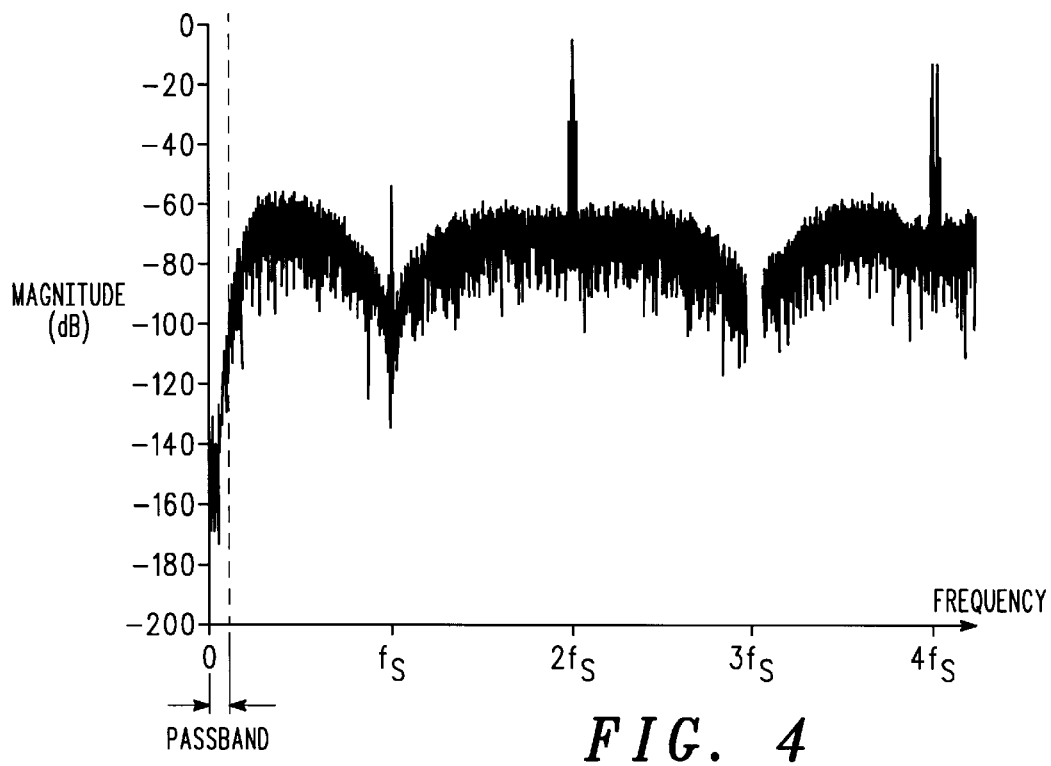
FIG. 4 illustrates in graphical form a frequency spectrum of an output signal of the switching amplifier of FIG. 1 using one-half cycle delay.

Illustrated in FIG. 4 is a frequency spectrum of a suppressed carrier where a one-half cycle of delay is used in inverting delay 26. As a result, there is a spectral null at a switching frequency, $f_S$, which is the reciprocal of one cycle of the switching frequency. In addition, there are nulls at all odd harmonics of the first null.

Figure 5:
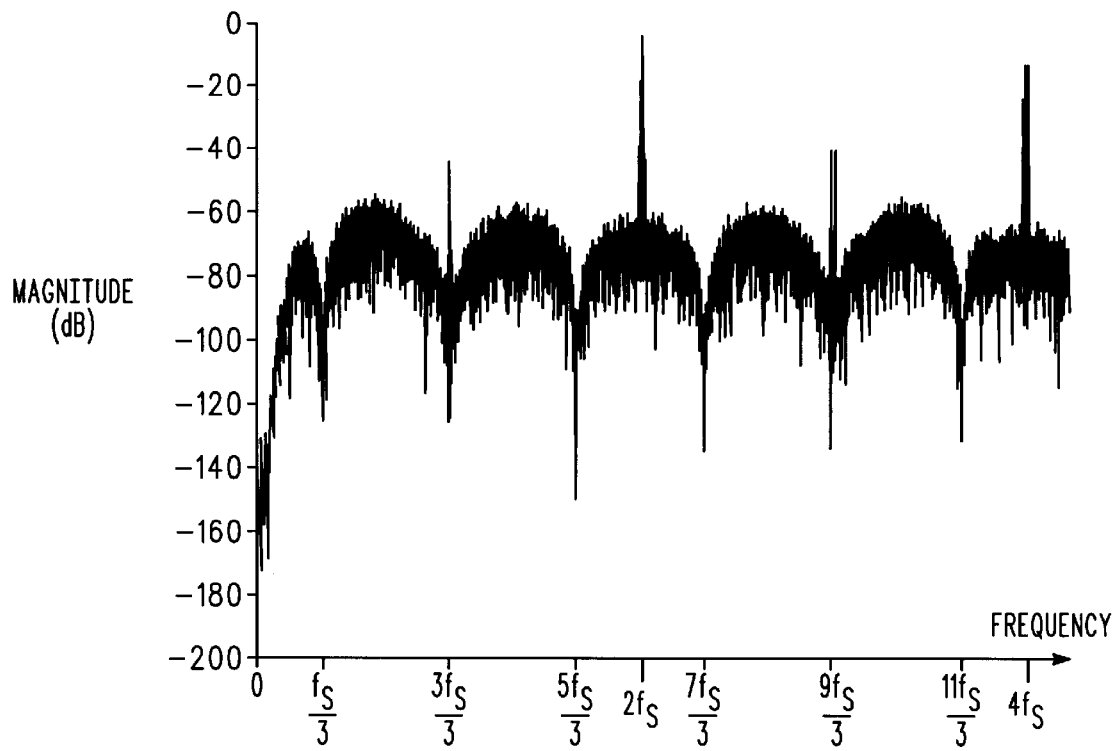
FIG. 5 illustrates in graphical form a frequency spectrum of an output signal of the switching amplifier of FIG. 1 using three half cycles of delay.

Illustrated in FIG. 5 is a frequency spectrum of a suppressed carrier where a delay of three half-cycles is used in inverting delay 26. As a result, there is a spectral null at a third of the switching frequency, $f_S/3$, which is the reciprocal of three cycles of the switching frequency. In addition, there are nulls at all odd harmonics of the first null (3 $f_S/3$, 5 $f_S/3$, 7 $f_S/3$, 9 $f_S/3$, etc.).

Figure 6:
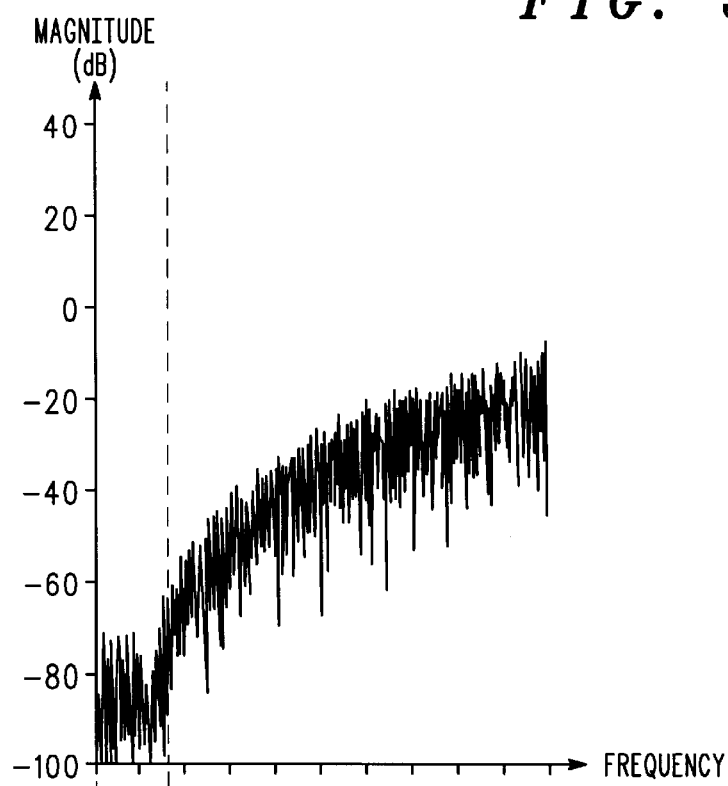
FIG. 6 illustrates in graphical form a frequency spectrum of a switching amplifier processing pulse density modulation signals without carrier suppression.

It should be well understood that the present invention is equally applicable to other switching modulation techniques. For example, illustrated in FIG. 6 is a frequency spectrum of a pulse density modulation (PDM) signal. Note that the noise in the passband is low and there is quantization noise at all frequencies beyond the passband.

Figure 7:
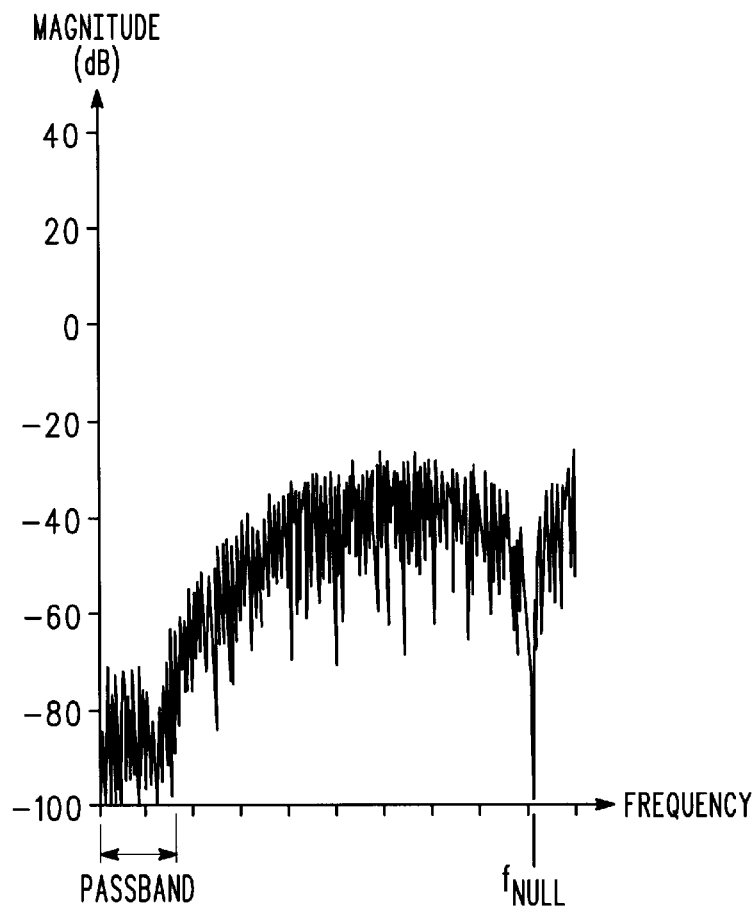
FIG. 7 illustrates in graphical form a frequency spectrum of a switching amplifier processing pulse density modulation signals with carrier suppression.

Illustrated in FIG. 7 is a frequency spectrum of a PDM signal in which a spectral null has been created. The frequency null is designated in FIG. 7 as having a frequency $f_{null}$. Note that the frequency $f_{null}$ can be adjusted by changing the delay in inverting delay unit 26. Thus it should be well understood that the spectral null method taught herein is applicable to most switching modulation techniques.

Figure 8:
FIG. 8 illustrates in block diagram form the signal processing unit of FIG. 1.

Illustrated in FIG. 8 is a block diagram of the signal processing unit 14 of FIG. 1. Again, an audio signal is used by way of example only and not as a limitation. The audio signal is provided as an input signal and is connected to an input of a sample rate converter 50. An output of sample rate converter 50 is connected to an input of a compensation filter 52. An output of compensation filter 52 is connected to an input of a modulation conversion unit 54. An output of modulation conversion unit 54 provides the switching signal that is connected to the gates of transistors 16 and 18 and to the input of inverting delay unit 26.

In operation, sample rate converter 50 functions to modify the sampling frequency of the audio signal. For example, if the audio signal were received from a CD player, the audio signal may be up sampled from 44.1K samples per second to 705.6K samples per second. Compensation filter 52 is used to compensate the frequency response in the passband of a signal droop created by the spectral null insertion. The delay and inversion of the method taught herein is distortionless at D.C., but has a small amplitude droop at higher audio frequencies in the passband. For high-end audio systems, including DVD audio, this droop may be not acceptable. Therefore, compensation filter 52 is used to correct the droop in the passband that will be subsequently created. In one form, the compensation filter 52 is a Finite Impulse Response (FIR) filter.

By now it should be appreciated that there has been provided circuitry and a method for creating a spectral frequency null in a differential output switching amplifier. By processing a single modulated signal to form two signals via an inversion and odd half-cycle delay, a null of the odd switching harmonics outside of a passband or baseband of frequencies may be implemented. As a result, filtering requirements are reduced and system cost thereby reduced. The addition of adding an inverting and delaying unit is negligible in terms of total circuitry for the system and does not involve complex circuitry. It should also be noted that the two switching signals being delayed from each other also improves the inband signal-to-noise ratio (SNR) somewhat, such as by one to two dB, and reduces out of band noise by more, such as up to ten dB.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the inverting delay circuitry may be implemented by any type of delay circuitry such as a clocked register, one or more inverter stages or buffer stages or other circuitry to implement the function of inverting and delaying by an odd number of half cycles. Also, the inverting delay function may be software controlled and user programmable to be flexible for various product applications. The switching amplifier circuitry implemented in the form of transistors 16, 18, 28 and 30 may be implemented by various other circuit forms for performing a differential switching function. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. Circuitry for creating at least one spectral null in a differential output switching amplifier, comprising:
    an input which receives an input signal;
    modulation conversion circuitry coupled to the input for modulating the input signal and generating a first switching signal from the input signal, the first switching signal being cyclic and having a cycle time that determines a switching frequency; and
    inverting delay circuitry coupled to the modulation conversion circuitry for generating a second switching signal from the first switching signal, the second switching signal being inverted and delayed by a delay amount as compared to the first switching signal, the delay amount being related to the switching frequency by being approximately a predetermined multiple of the cycle time in order to provide the at least one spectral null.

2. The circuitry of claim 1, further comprising a first output for providing the first switching signal to a first input of the differential output switching amplifier and a second output for providing the second switching signal to a second input of the differential output switching amplifier.

3. The circuitry of claim 1, wherein each pulse of the second switching signal has a same pulse width as a corresponding pulse of the first switching signal.

4. The circuitry of claim 1, wherein the modulation circuitry comprises at least one of pulse width modulation (PWM) circuitry and pulse density modulation (PDM) circuitry.

5. The circuitry of claim 4, wherein each of the first switching signal and the second switching signal is of a signal type selected from a group consisting of a PWM signal and a PDM signal.

6. The circuitry of claim 5, wherein each of the first switching signal and the second switching signal is a two-sided PWM signal.

7. The circuitry of claim 1, further comprising compensation filter circuitry coupled to receive and filter the input signal and coupled to provide the filtered input signal to the modulation conversion circuitry, wherein the first switching signal is generated from the filtered input signal.

8. The circuitry of claim 7, wherein the compensation filter circuitry comprises a finite impulse response (FIR) filter.

9. The circuitry of claim 1, wherein the delay amount is at least approximately a quarter of the cycle time.

10. The circuitry of claim 1, wherein the delay amount is a multiple of approximately half of the cycle time.

11. Circuitry for creating at least one spectral null in a differential output switching amplifier, comprising:

input means for receiving an input signal;

processing means for generating a first switching signal from the input signal, the first switching signal having a cycle time that determines a corresponding predetermined switching frequency; and inverting delay means for generating a second switching signal from the first switching signal, wherein the second switching signal is inverted and delayed by a delay amount as compared to the first switching signal, the delay amount being related to the predetermined switching frequency by being fixed at approximately a predetermined percentage of the cycle time that is an integer multiple of one-fourth of the cycle time in order to provide the at least one spectral null.

12. The circuitry of claim 11, wherein each pulse of the second switching signal has a same pulse width as a corresponding pulse of the first switching signal.

13. The circuitry of claim 11, further comprising output means for providing the first switching signal to a first input of the differential output switching amplifier and the second switching signal to a second input of the differential output switching amplifier.

14. The circuitry of claim 11, wherein each of the first switching signal and the second switching signal is of a signal type selected from a group consisting of a PWM signal and a PDM signal.

15. The circuitry of claim 11, wherein the delay amount is approximately a quarter of the cycle time.

16. The circuitry of claim 15, wherein the delay amount is approximately one-half of the cycle time.

17. A method for creating at least one spectral null in a differential output switching amplifier, comprising:

receiving an input signal;

generating a first switching signal from the input signal for a first input of the differential output switching amplifier, the first switching signal being cyclic and having a cycle time that determines a predetermined switching frequency; and generating a second switching signal from the first switching signal for a second input of the differential output switching amplifier, wherein the second switching signal is inverted and delayed by a delay amount as compared to the first switching signal, the delay amount being related to the predetermined switching frequency by being approximately a predetermined multiple of the cycle time in order to provide the at least one spectral null.

18. The method of claim 17, wherein each pulse of the second switching signal has a same pulse width as a corresponding pulse of the first switching signal.

19. The method of claim 17, wherein the delay amount is a multiple of half of the cycle time.

20. The method of claim 17, wherein each of the first switching signal and the second switching signal is of a signal type selected from a group consisting of a PWM signal and a PDM signal.

21. Circuitry for creating at least one spectral null in a differential output switching amplifier, comprising:

processing circuitry which samples an input signal at a sampling frequency and generates a first switching signal from the input signal, the first switching signal having a cycle time that corresponds to a predetermined switching frequency;

inverting delay circuitry coupled to the processing circuitry and which generates a second switching signal from the first switching signal, wherein the second switching signal is inverted and delayed by a delay amount as compared to the first switching signal, the delay amount being related to the predetermined switching frequency by being a predetermined percentage of the cycle time in order to provide the at least one spectral null at an odd multiple of the sampling frequency; and differential output switching amplifier circuitry having a first input coupled to the processing circuitry for receiving the first switching signal and having a second input coupled in the inverting delay circuitry for receiving the second switching signal.

22. The circuitry of claim 21, wherein the processing circuitry comprises at least one of PWM generating circuitry and PDM generating circuitry to generate the first switching signal.

23. The circuitry of claim 21, further comprising:

compensation filter circuitry coupled to receive and filter the input signal and provide the filtered input signal to the processing circuitry.

24. The circuitry of claim 21, wherein the delay amount is a multiple of half of the cycle time.

25. The circuitry of claim 21, wherein each pulse of the second switching signal has a same pulse width as a corresponding pulse of the first switching signal.

26. A differential output switching amplifier, comprising:

a first input for receiving an input audio signal that has been sampled at a sampling frequency, the first switching signal having a predetermined switching frequency corresponding to a cycle time of the first switching signal;

input circuitry for providing a second switching signal that is inverted and delayed by a delay amount as compared to the first switching signal the delay amount being related to the predetermined switching frequency by being a predetermined fractional percentage of the cycle time in order to provide at least one spectral null at a predetermined multiple of the sampling frequency;

a second input coupled to the input circuitry for receiving the second switching signal; and output circuitry for processing the first switching signal and the second switching signal and providing at least one spectral null in a frequency spectrum corresponding to the first switching signal and the second switching signal.

27. The differential output switching amplifier of claim 26, wherein the first switching signal and the second switching signal are PWM signals, and the at least one null occurs at a harmonic of the sampling force.

28. The differential output switching amplifier of claim 26, wherein each pulse of the second switching signal has a same pulse width as a corresponding pulse of the first switching signal and the predetermined multiple of the sampling frequency is an odd multiple.

\* \* \* \* \*

UNITED STATES PATENT AND TRADEMARK OFFICE
CERTIFICATE OF CORRECTION

PATENT NO.    : 6,605,991 B2
DATED         : August 12, 2003
INVENTOR(S)   : Pallab Midya and William Roeckner It is certified that error appears in the above-identified patent and that said Letters Patent is hereby corrected as shown below:

Column 8,
Line 18, please delete "in" and replace with -- to --
Line 43, please delete "signal" and replace with -- signal, --
Line 51, please delete "providing" and replace with -- providing the --
Line 58, please delete "force" and replace with -- frequency --

Signed and Sealed this

Twenty-third Day of December, 2003

JAMES E. ROGAN
*Director of the United States Patent and Trademark Office*